(12) United States Patent
Tzu et al.

(10) Patent No.: US 6,432,588 B1
(45) Date of Patent: Aug. 13, 2002

(54) METHOD OF FORMING AN IMPROVED ATTENUATED PHASE-SHIFTING PHOTOMASK

(75) Inventors: San-De Tzu, Taipei; Ching-Shiun Chiu, Kaohsiung, both of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 86 days.

(21) Appl. No.: 09/729,155

(22) Filed: Dec. 4, 2000

(51) Int. Cl.[7] .............................. G03F 9/00; G03C 5/00
(52) U.S. Cl. ........................................... 430/5; 430/296
(58) Field of Search ............................ 430/5, 296, 394; 250/492.22, 492.3

(56) References Cited

U.S. PATENT DOCUMENTS

| | | | |
|---|---|---|---|
| 5,532,090 A | 7/1996 | Borodovsky | 430/5 |
| 5,723,235 A | 3/1998 | Tsudaka et al. | 430/5 |
| 5,723,236 A * | 3/1998 | Inoue et al. | 430/5 |
| 5,783,337 A | 7/1998 | Tzu et al. | 430/5 |
| 5,804,339 A | 9/1998 | Kim | 430/5 |
| 5,853,923 A | 12/1998 | Tzu | 430/5 |
| 5,888,678 A | 3/1999 | Tzu et al. | 430/5 |
| 6,313,476 B1 * | 11/2001 | Shimizu et al. | 250/492.22 |

* cited by examiner

*Primary Examiner*—S. Rosasco
(74) *Attorney, Agent, or Firm*—George O. Saile; Stephen B. Ackerman; William J. Stoffel

(57) ABSTRACT

A method of fabricating an attenuating phase-shifting photomask, comprising the following steps. A photomask blank is provided having an upper resist layer overlying a chromium layer, the chromium layer overlying a phase-shifting layer, and the phase-shifting layer over a substrate. The photomask blank having a low pattern density area with a pattern density less than 0.25, a middle pattern density area with a pattern density from about 0.25 to 0.70, and a high pattern density area with a pattern density between about 0.70 and 1.00. The photomask blank is exposed to a first E-beam energy in a single step wherein the low pattern density area is exposed to the first E-beam energy adjusted by a first dosage factor, the middle pattern density area is exposed to the first E-beam energy adjusted by a second dosage factor, and the high pattern density area is exposed to the first E-beam energy adjusted by a third dosage factor. The photoresist blank is exposed to a second E-beam energy in a single step wherein the low and middle density areas are equally exposed to the second E-beam energy. The exposed resist layer is exposed wherein portions of the resist is removed to expose the chromium layer. The exposed chromium layer is etched to expose the underlying phase-shifting layer. The exposed phase-shifting layer is etched to expose the substrate. The resist overlying the chromium layer is etched away to complete fabrication of the attenuating phase-shifting photomask.

20 Claims, 5 Drawing Sheets

METHOD OF FORMING AN IMPROVED ATTENUATED PHASE-SHIFTING PHOTOMASK

FIELD OF THE INVENTION

The present invention relates generally to methods for forming phase-shifting photomasks used to fabricate semiconductor structures, and specifically a method for forming an improved attenuated phase-shifting photomask by optimizing the first of two electron beam dosages.

BACKGROUND OF THE INVENTION

As integrated circuits (IC) become smaller and smaller through miniaturization, photolithography—the process that sets the surface dimensions of the various parts of the devices and circuits of the integrated circuits—has advanced to 0.35 microns and below. Thus new technologies are required to increase the resolution of the imaging lens, i.e. the ability to apply surface patterns as close to the design requirements as possible. Several techniques have developed to accomplish this requirement.

Phase shifting photomasks (PSM) permit the use of interference between out of phase light waves to reduce the spatial frequency of a given object, to enhance its edge contrast, or both. By applying a patterned layer of transmitting material that delay the light waves 180° out of phase at critical locations in a design, the 180° out of phase light waves cancel out the light waves passing through an adjacent clear area edge producing a more sharply defined interface.

Attenuated phase-shifting photomasks (APSM) use an attenuator—a metallic-like absorbing film such as molybdenum silicide oxynitride (MoSiON) or chromium oxynitride (CrON)—that allows 5–15% light transmittance. The partial light transmittance through the attenuator causes production of phase shifted light.

The electron-beam (E-beam) double exposure method of halftone APSMs causes overexposure for large exposed areas, especially in the letters' pattern and the frame pattern. Letters are used to identify individual photomasks so they may be traced for quality control measures. This causes chromium (Cr) and attenuator material loss in the subsequent steps of the double exposure method of halftone APSM formation leading to, for example, many pinholes and nuisance defects that are then discovered during photomask inspection.

U.S. Pat. No. 5,783,337 to Tzu et al. describes a process for fabricating an attenuated phase-shifting photomask (APSM). The resist layer of the photoresist mask blank is divided into three areas: a main pattern area; a secondary pattern area; and a border area. The photoresist mask blank is exposed to electron-beam (E-beam) energy wherein the main pattern area receives a first dose of E-beam energy, the secondary pattern area received a second dose of E-beam energy that is less than the main pattern area's first dose of E-beam energy, and the border area is not exposed to the E-beam dose. The photoresist layer is then developed, the photoresist layer overlying the main pattern area is removed to expose the underlying Cr layer which is then etched to expose the underlying attenuator layer. The exposed attenuator layer is in turn etched to expose the underlying substrate. The photoresist layer overlying the secondary pattern layer is then etched away exposing the Cr layer which is etched to expose the underlying attenuator layer. Lastly, the photoresist layer overlying the border area is stripped away leaving a patterned phase-shifting layer in the main pattern area and a Cr layer in the border area that prevents light leakage from around the border.

U.S. Pat. No. 5,723,235 to Tsudaka et al. describes a method of producing a photomask, exposing the photomask produced, and a method of manufacturing a semiconductor device using the produced photomask. An optimization method is used for exposing resist to produce the photomask.

U.S. Pat. No. 5,532,090 to Borodovsky describes a method and apparatus for forming openings in a photosensitive layer by first exposing an unpatterned photosensitive layer to a first mask having an opening pattern with dimensions within tight (for a given technology generation) process tolerances. Next, prior to development, the photosensitive layer is exposed to a second mask having a grid of clear spaces surrounding the opening pattern. The patterns and exposure doses of the first and second reticle are designed to produce a combined intensity profile and corresponding latent image in the photoresist layer that results in an opening/via pattern of reduced dimension upon resist development.

U.S. Pat. No. 5,888,678 to Tzu et al. describes an attenuated phase-shifting mask and a method of making same that has a rim type attenuating phase-shifting mask (APSM) pattern, for formation of small contact holes, in a second region of a transparent mask substrate and a binary mask pattern, for formation of larger holes, in a first region of the same transparent mask substrate. The formation of the rim type APSM pattern and the binary mask pattern on the same transparent mask substrate avoids the problems due to side lobe effects and increases throughput and decreases fabrication costs of integrated circuit wafers.

U.S. Pat. No. 5,853,923 to Tzu describes a method of forming a rim type APSM which requires only one resist layer and one resist developing step using a single developing solution. The resist layer is exposed to a first pattern using a first exposure dose sufficient to expose the first pattern in the entire thickness of the resist layer. The resist layer is then exposed to a second pattern using a second exposure dose sufficient only to expose the second pattern in a top portion of the resist layer.

U.S. Pat. No. 5,804,339 to Kim describes methods of fabricating a photomask including a correction exposure, that is less than a first exposure dosage, utilizing a correction exposure mask.

SUMMARY OF THE INVENTION

Accordingly, it is an object of the present invention to optimize the first E-beam dosing of a double E-beam exposure method by a segmentation method to form attenuated phase-shifting photomasks (APSM).

Another object of the present invention is to optimize the first E-beam dosing of a double E-beam exposure method by a segmentation method to reach uniform thickness of exposed photoresist of halftone APSMs.

A further object of the present invention is to optimize the first E-beam dosing of a double E-beam exposure method by a segmentation method to form attenuated phase-shifting photomasks to avoid overexposure for large exposed areas.

Yet another object of the present invention is to optimize the first E-beam dosing of a double E-beam exposure method by a segmentation method in forming attenuated phase-shifting photomasks to reduce pinholes and nuisance defects found during APSM inspection.

Other objects will appear hereinafter.

It has now been discovered that the above and other objects of the present invention may be accomplished in the following manner. Specifically, the first E-beam dosage of a double E-beam exposure method is optimized by a segmentation method to reach uniform thickness of the exposed photoresistor of halftone attenuated phase-shifting photomasks (APSM). A photomask blank is provided. The photomask blank having an upper resist layer overlying a chromium layer, the chromium layer overlying a phase-shifting layer, and the phase-shifting layer over a substrate. The photomask blank having a low pattern density area with a pattern density less than 0.25, a middle pattern density area with a pattern density from about 0.25 to 0.70, and a high pattern density area with a pattern density between about 0.70 and 1.00. The photomask blank is exposed to a first E-beam energy in a single step wherein the low pattern density area is exposed to the first E-beam energy adjusted by a first dosage factor, the middle pattern density area is exposed to the first E-beam energy adjusted by a second dosage factor, and the high pattern density area is exposed to the first E-beam energy adjusted by a third dosage factor. The photoresist blank is exposed to a second E-beam energy in a single step wherein the low and middle density areas are equally exposed to the second E-beam energy. The exposed resist layer is exposed wherein portions of the resist is removed to expose the chromium layer. The exposed chromium layer is etched to expose the underlying phase-shifting layer. The exposed phase-shifting layer is etched to expose the substrate. The resist overlying the chromium layer is etched away to complete fabrication of the attenuating phase-shifting photomask.

BRIEF DESCRIPTION OF THE DRAWINGS

For a more complete understanding of the invention, reference is hereby made to the drawings, in which.

DETAILED DESCRIPTION OF THE PREFERRED EMBODIMENT

A method of optimizing a first electron beam (E-beam) dosage of a double E-beam exposure method by a segmentation method to achieve uniform thickness of the exposed photoresistor layer of a halftone APSM is disclosed. In the following description, numerous specific details are set forth such as specific materials, reticule patterns, dimensions, etc. in order to provide a thorough understanding of the present invention. It will be obvious, however, to one skilled in the art that many of these specific details need not be employed to practice the present invention. In other instances, well known materials or methods have not been described in detail in order to avoid unnecessarily obscuring the present invention.

TABLE 1

|  | High Pattern Density Frame Area | Medium Pattern Density General Area or Letter Area | Low Pattern Density Device Pattern Area |
|---|---|---|---|
| Density Range | >0.7 | 0.25–0.7 | <0.25 |
| Dosages Factor | 0.82–1.0 | 1.0–1.3 | 1.3–1.4 |
| Fig. 2 | 110 Frame Area | 130 Letter Area | 120 Device Pattern Area |

Figure 1:
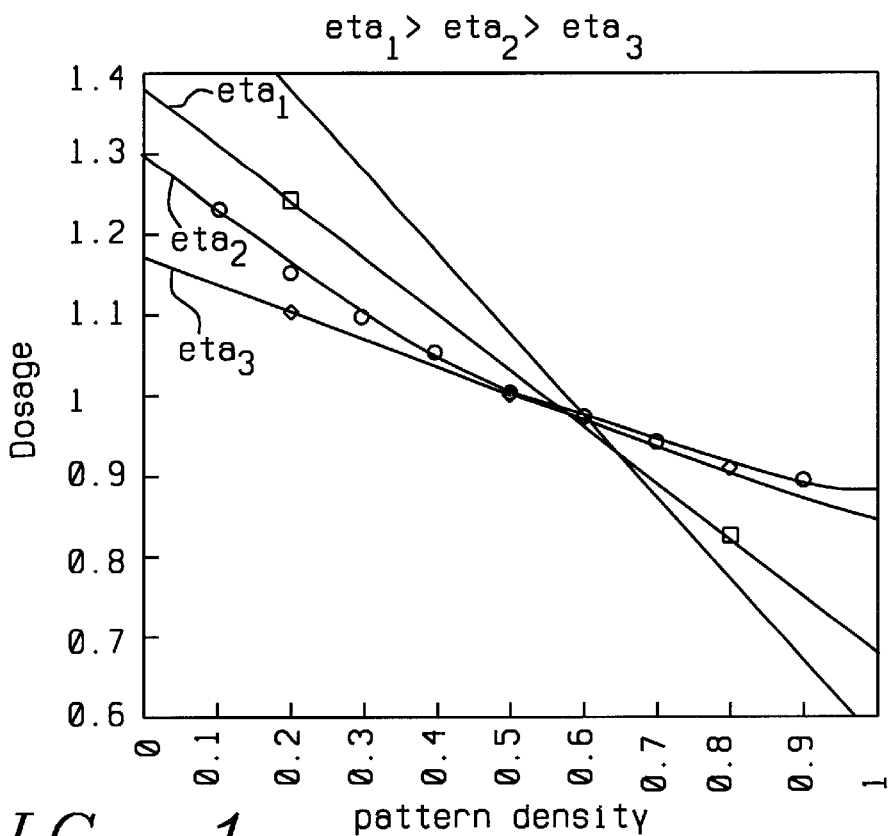
FIG. 1 is a plot of linear E-beam dosage versus pattern density.

Accordingly in a prior method, shown in FIG. 1, E-beam dosage is plotted versus the pattern density of an APSM mask for three different eta conditions. "Eta" means the system characteristic that is decided by the E-beam system and the mask photoresist characteristic.

For example, referring to FIG. 1, when the pattern density is 0.3, the dosage of the system eta 1, is greater than the dosage of the system eta 3. The inventors have discovered that this dosage must therefore be modified to get uniform exposure. In a further example using the eta 3 plot, if a pattern density of 0.5 is exposed with a 20 $\mu c/cm^2$ dosage, then for a 0.2 pattern density the dosage will be (20 $\mu c/cm^2$)(1.1)=22 $\mu c/cm^2$, and for a 0.7 pattern density the dosage will be (20 $\mu c/cm^2$)(0.9)–18 $\mu c/cm^2$.

Therefore, for the same eta, when the pattern density is low, a high dosage is used, and when the pattern density is high, a low dosage is used. For example, when pattern density is high, E-beam exposure of each shot is almost adjacent and the back-scattering effect is strong, so a low dosage should be used to compensate for this condition.

For different processes (E-beam dosage, resist, etc.), a suitable eta value must be chosen to keep critical dimension (CD) uniformity (compensate E-beam proximity effect between dense and isolate patterns).

Figure 2A:
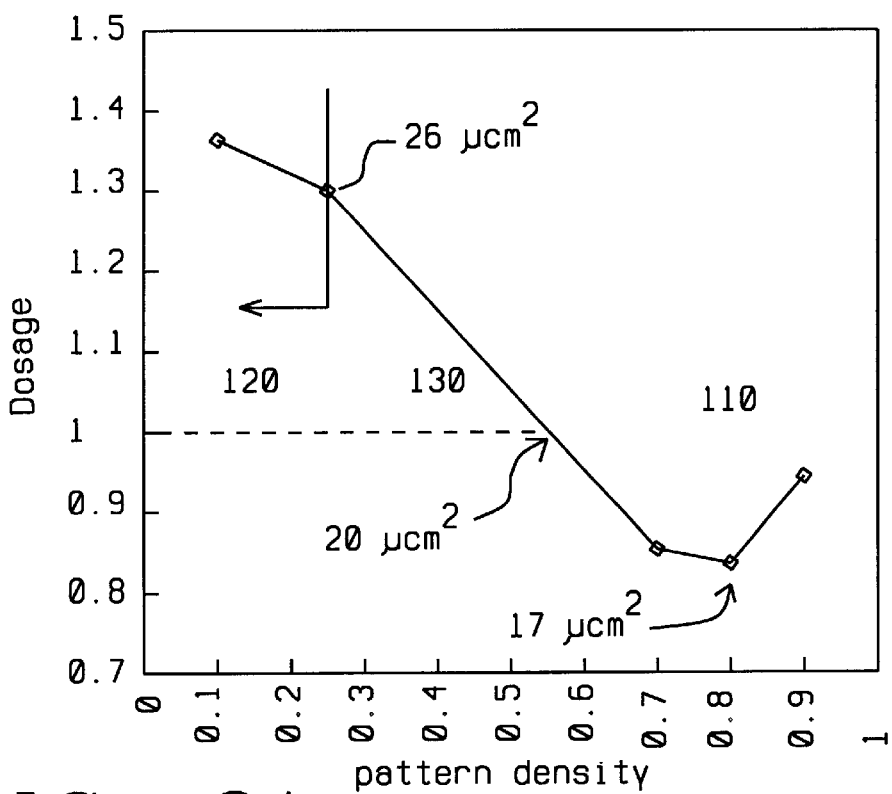
FIG. 2A illustrates the E-beam dosage optimization by the segmentation method of the present invention.

As shown in FIG. 2A, three different pattern areas have been discerned based upon the amount of pattern density within those areas. The low pattern density area is from 0 to 0.25 and is termed pattern area 120. The middle pattern density area is from 0.25 to 0.7 and is termed general area 130. The high pattern density area is from 0.7 to 1.0 and is termed frame area 110. Where:

pattern density=actual E-beam exposure/area pattern area

Figure 2B:
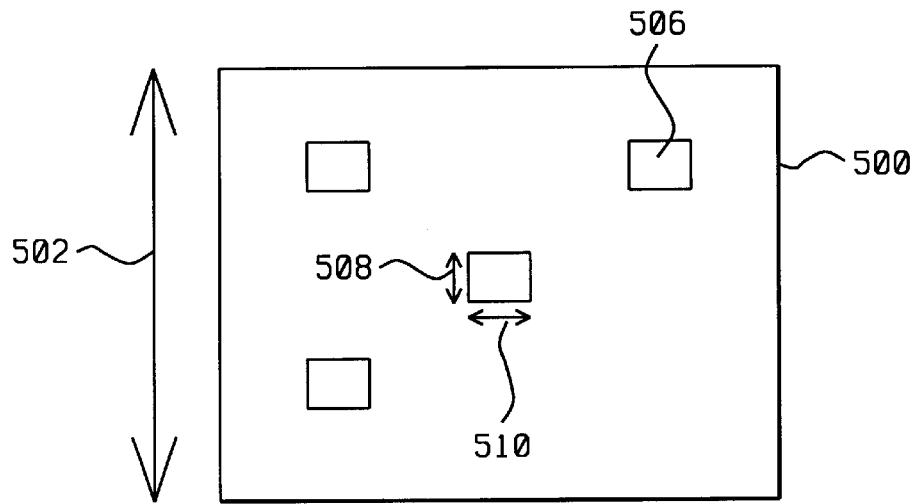
FIG. 2B illustrates a pattern area having a pattern density of 0.04.

For example, FIG. 2B illustrates a pattern area 500 having a pattern density of 0.4. Pattern area 500 has dimensions 502, 504 that are 10$\mu$m, for example. Therefore the pattern area is:

(10 $\mu$m×10 $\mu$m)=100 $\mu m^2$

Within pattern area 500 are four sub-areas 506 of actual E-beam exposure. Each sub-area 506 has dimensions 508, 510 that are 1 $\mu$m, for example. Therefore the actual E-beam exposure area for the total sub-areas 506 within pattern area 500 is:

4×(1 $\mu$m×1 $\mu$m)=4 $\mu m^2$

Therefore the pattern density of pattern area 500 is:

pattern area=4 $\mu m^2$/100 $\mu m^2$=0.4

Figure 3:
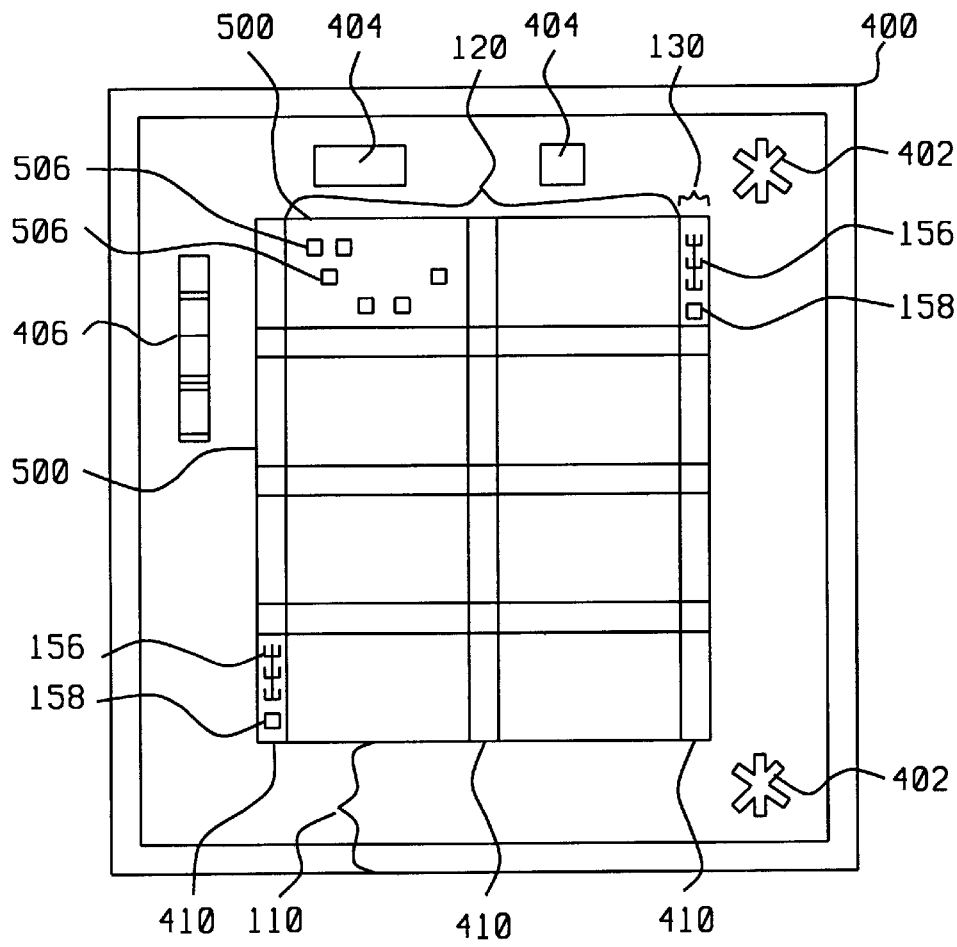
FIG. 3 shows a top plan view of the dual E-beam exposure a mask in accordance with the present invention.

FIG. 3 shows an example of a top down view of a mask 400 having grids with low 120, medium 130 and high pattern 110 densities E-beam exposed in accordance with the preferred embodiment of the present invention. Mask 400 may be fabricated by prior art methods and processes unless otherwise noted and may be, for example, an attenuated phase-shifting photomask (APSM) fabricated from a photomask blank comprising: a phase-shifting layer overlying a substrate; a chromium layer overlying the phase-shifting layer; and a photoresist (resist) layer overlying the chromium layer. Mask 400 includes, high pattern density or frame area 110 medium pattern density, general, or letter area 130, and low pattern density, or device/contact pattern area 120.

Mask area 400 also includes: alignment marks 402 (for photo stepper), bar code area 406, and clear out windows 404, for example, within frame area 110; test lines 410, CD boxes 156, and overlay measure patterns 158 within general area 130; and actual E-beam exposure areas 506 (see FIG. 2B) inside pattern areas 500, for example, within device pattern area 120 (although actual E-beam exposure areas 506 are generally in each pattern area 500 of FIG. 3, they are only shown in one exposure area 500 in FIG. 3).

These three areas 110, 120, 130 receive the E-beam dosages as shown in Table 1 and FIGS. 1 and 2A. As noted above, the frame pattern 110 includes a clear out window 404, bar code 406, and alignment marks 402, for example. Frame pattern 110 represents the patterns that were E-beam exposed larger than about 10 μm.

Prior E-beam double exposure methods of halftone APSM mask formation cause overexposure of large exposed areas, especially in the letter's pattern and frame area. Letters are used to identify the mask area and a letter pattern is always beside an overlay mark or CD bar 156 to indicate which layer is the mask. Using the principle of the present invention, the first E-beam dosages were varied according to each of three pattern densities 110, 120, 130 to avoid or minimize such overexposure which otherwise leads to undesired chromium and shifter, or attenuator, layer material loss resulting in many pinholes and nuisance defects detected during the APSM mask inspection stage.

Generation of a dosage map calculation by a victual exposure:

1) divide exposed area into a grid with a grid size between about 5.12×5.12 and 10.24×10.24 $\mu m^2$;
2) calculate exposure area in each grid;
3) smoothing of exposure in each grid;
4) make dose correction table inversely proportional to the exposure area (See FIG. 1—E-dose vs. pattern density);

The prior real time correction method (victual exposure method) uses a smooth eta curve to keep CD uniformity, and the prior E-beam proximity method is only used in frame pattern area 110 to keep CD uniformity between density and isolate CD. While the method of the present invention use must keep both CD uniformity and resist thickness. The method of the present invention uses only "120" dosage correction and second exposure (ghost correction) to do proximity correction for contact pattern.

The mask 400 of FIG. 3 is exposed to two E-beam exposures. The structures within frame area 110, general area 130/test lines 410, and device pattern area 120 are exposed to a first E-beam exposure having dosages that change with pattern density 110, 130, 120 as shown in FIG. 2 and discussed above. A second E-beam exposure having a constant dosage is applied within general area 130/test lines 410, and device pattern area 120.

Figure 4A:
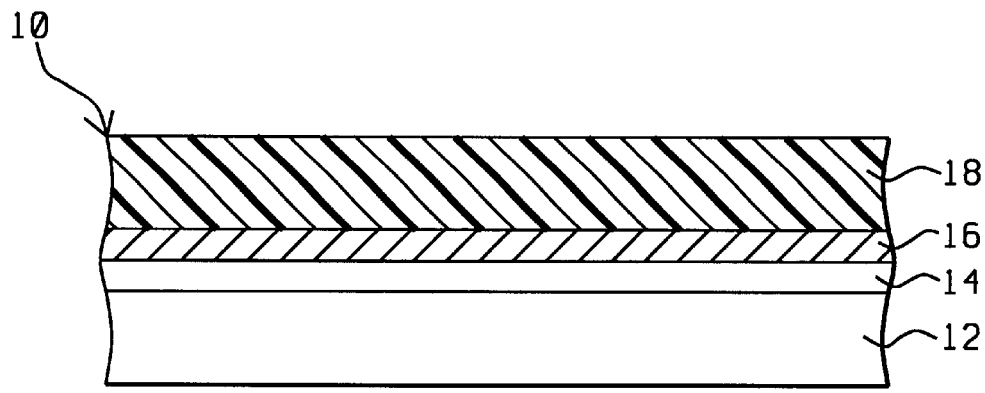
FIGS. 4A–4H illustrate a series of schematic cross-sectional diagrams illustrating the results of progressive stages in forming a combination attenuated phase-shifting photomask (APSM), rim type, and binary mask APSM photomask with which the method of the present invention may be used.

Referring now to FIGS. 4A–4H, there is shown series of schematic diagrams illustrating the results of progressive stages in forming a combination attenuated phase-shifting mask (APSM), rim type, and binary mask APSM photomask with which the method of the present invention may be used. FIG. 4A shows an APSM blank 10 having a attenuating phase-shifting layer, also known as the attenuator or shifter layer, 14 overlying a substrate 12.

The substrate 12 is preferably quartz. The attenuator layer 14 is preferably MoSiON having a thickness from about 850 to 1600 Å with a more preferred thickness of about 1000 Å, or may be CrON having a thickness from about 1000 to 1600 Å with a more preferred thickness of about 1200 Å, or any other acceptable material known in the prior art.

A chromium (Cr) layer 16 preferably having a thickness from about 700 to 1000 Å with a more preferred thickness of about 800 Å overlies attenuator layer 14, and a resist layer 18 overlies chromium layer 16. Chromium layer 16 is preferably opaque. This completes the formation of the APSM (combination APSM/rim type/binary mask APSM) photomask blank 10.

Photomask blank 10 may include a high 110, medium or middle 130, and a low 120 pattern density areas defined previously and shown in Table 1.

Figure 4B:
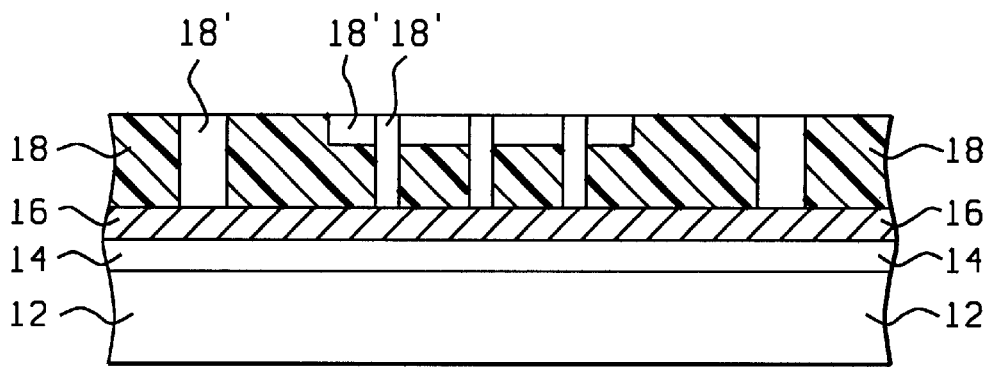

As shown in FIG. 4B, APSM (combination APSM/rim type/binary mask APSM) photomask blank 10 is exposed to a first electron-beam (E-beam) energy in a single step. The high 110, middle 130, and low 120 pattern density areas are subjected to the first E-beam energy adjusted to the first, second and third dosage factors as shown in Table 1 and calculated using FIG. 2 as described above.

The low 120 and middle 130 pattern density areas are exposed to a second, ghost correction E-beam energy that does not change with pattern density and is generally. The first electron beam energy is greater than the second electron beam energy.

The first E-beam energy is changed with pattern density as FIG. 2 and is calculated in the same method as the previous example regarding "eta 3" in FIG. 1 (see above). The second E-beam energy is a fixed dosage.

Figure 4C:
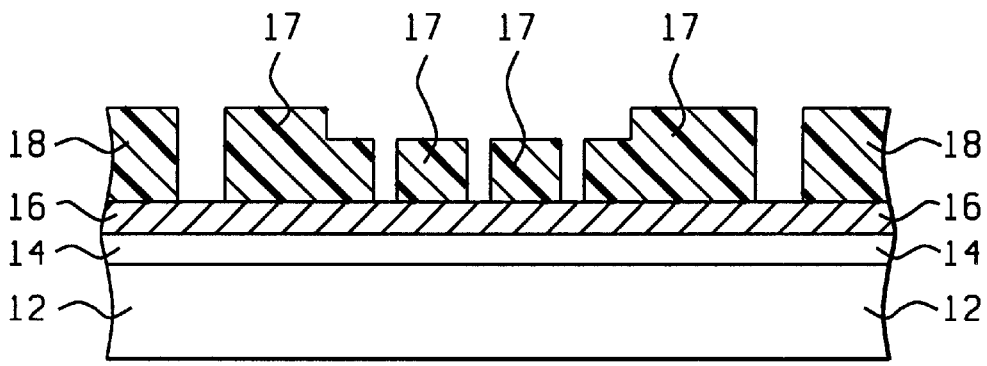

As shown in FIG. 4C, the exposed resist layer 18 is developed, baked and removed to expose underlying chromium layer 16 and is partially removed in areas 19 creating different resist step heights.

Figure 4D:
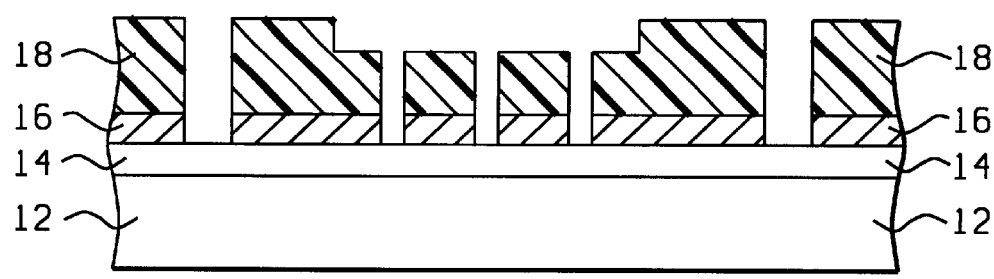

As shown in FIG. 4D, the exposed Cr layer 16 is etched by wet etching thus exposing underlying attenuating phase-shifting layer 14. For example the Cr wet etching solution may be a mixture of $HClO_3$ and $(Ce(NH_4)_2(NO_3)_6)$.

Figure 4E:
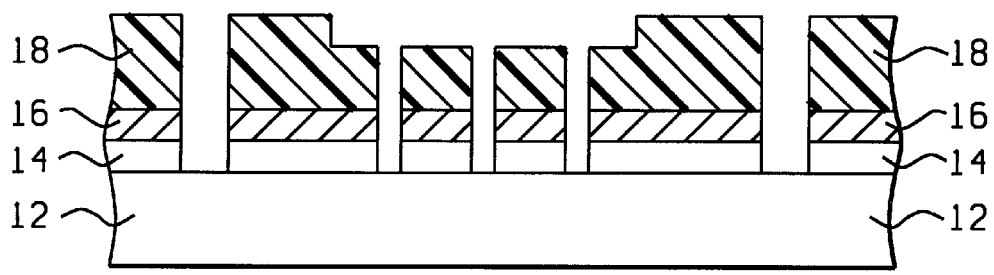

As shown in FIG. 4E, the exposed attenuating phase-shifting layer 14 is etched by dry etching, for example using $CF_4$ and $O_2$, thus exposing underlying quartz substrate 12.

The exposed areas of resist have different thicknesses and structure. Thus, as shown in FIG. 4F, an $O_2$ plasma dry etch is used to remove the E-beam resist that was exposed to the lower energy dosage(s).

Figure 4F:
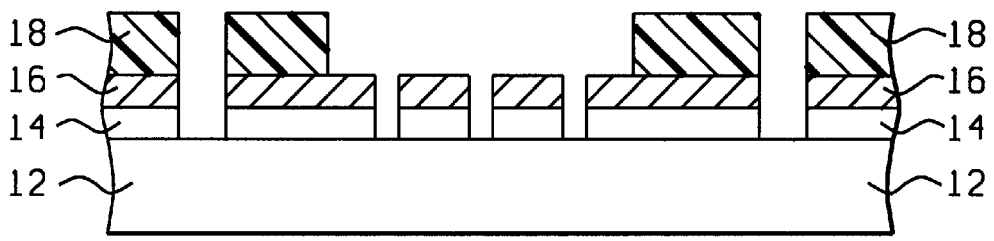
Figure 4G:
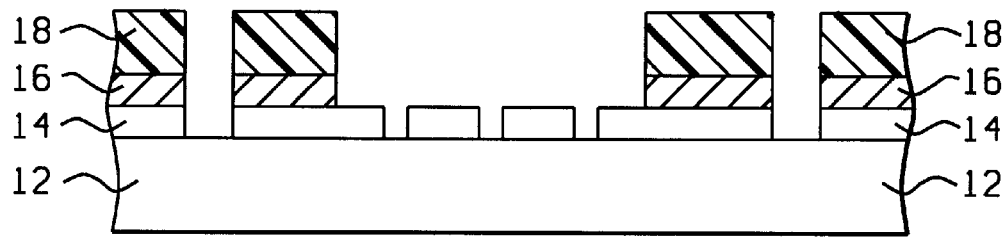

As shown in FIG. 4G, the remaining exposed Cr layer 16 of FIG. 4F, is wet etched away to expose underlying phase-shifting layer 14.

Figure 4H:
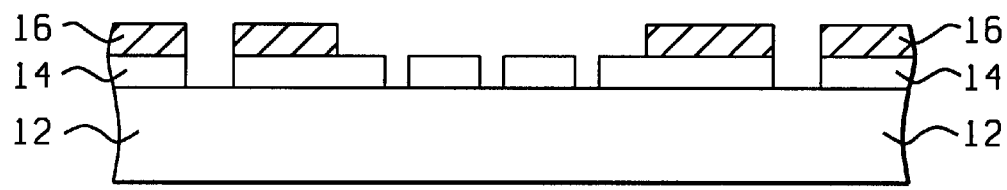

As shown in FIG. 4H, the remaining resist 18 is then stripped to leave a patterned attenuated phase-shifting mask portion, a patterned rim type attenuated phase-shifting mask portion, and an APSM binary mask portion. The remaining Cr layer pattern 16 prevents light transmittance, thereby preventing the problem of light leakage at the edges.

The APSM of the present invention is operative to light with defraction phenomena such as ultraviolet (UV), deep ultraviolet (DUV), G-Line (436 nanometers, I-Line (365 nanometers) and the like.

The pattern density is calculated by dividing the blank into grid squares having a length/width of about 10.24 μm and dividing the area of the grid square that will be exposed to said electron-beam energy between the area of the grid square. See FIG. 3 which shows a gridded E-beam exposure pattern having different pattern areas 110, 130, 120.

While particular embodiments of the present invention have been illustrated and described, it is not intended to limit the invention, except as defined by the following claims.

We claim:

1. A method of fabricating an attenuating phase-shifting photomask, comprising the steps:

providing a photomask blank having an upper resist layer overlying a chromium layer, said chromium layer overlying a phase-shifting layer, and said phase-shifting layer over a substrate; said photomask blank having a low pattern density area with a pattern density less than 0.25, a middle pattern density area with a pattern density from about 0.25 to 0.70, and a high pattern density area with a pattern density between about 0.70 and 1.00;

exposing said photomask blank to a first E-beam energy in a single step wherein said low pattern density area is exposed to said first E-beam energy adjusted by a first dosage factor, said middle pattern density area is exposed to said first E-beam energy adjusted by a second dosage factor, and said high pattern density area is exposed to said first E-beam energy adjusted by a third dosage factor;

exposing said photoresist blank to a second E-beam energy in a single step wherein said low and middle density areas are equally exposed to said second E-beam energy;

developing said exposed resist layer wherein portions of said resist is removed to expose said chromium layer;

etching through said exposed chromium layer to expose said underlying phase-shifting layer;

etching through said exposed phase-shifting layer to expose said substrate;

etching away said resist overlying said chromium layer to complete fabrication of said attenuating phase-shifting photomask.

2. The method of claim 1, wherein said first dosage factor is from about 1.3 to 1.4, said second dosage factor is from about 1.0 to 1.3, and said third dosage factor is from about 0.82 to 1.0.

3. The method of claim 1, wherein said substrate is quartz.

4. The method of claim 1, wherein said phase-shifting layer comprises MoSiON and has a thickness from about 1000 and 1600 Å.

5. The method of claim 1, wherein said phase-shifting layer comprises CrON and has a thickness from about 1000 and 1600 Å.

6. The method of claim 1, wherein said chromium layer comprises chromium and chromium oxide.

7. The method of claim 1, wherein said chromium layer has a thickness of from about 950 and 1100 Å.

8. The method of claim 1, wherein the pattern density is calculated by dividing said photomask blank into grid squares having a length by width from about 5.12 by 5.12 to 10.24 by 10.24 $\mu m^2$, and dividing the area of said grid squares by the total area exposed to said first E-beam energy within each said grid square.

9. A method of fabricating an attenuating phase-shifting photomask, comprising the steps:

providing a photomask blank having an upper resist layer overlying a chromium layer, said chromium layer overlying a phase-shifting layer, and said phase-shifting layer over a substrate; said photomask blank having a low pattern density area with a pattern density less than 0.25, a middle pattern density area with a pattern density from about 0.25 to 0.70, and a high pattern density area with a pattern density between about 0.70 and 1.00;

exposing said photomask blank to a first E-beam energy in a single step wherein said low pattern density area is exposed to said first E-beam energy adjusted by a first dosage factor of from about 1.3 to 1.4, said middle pattern density area is exposed to said first E-beam energy adjusted by a second dosage factor of from about 1.0 to 1.3, and said high pattern density area is exposed to said first E-beam energy adjusted by a third dosage factor of from about 0.82 to 1.0;

exposing said photoresist blank to a second E-beam energy in a single step wherein said low and middle density areas are equally exposed to said second E-beam energy;

developing said exposed resist layer wherein portions of said resist is removed to expose said chromium layer;

etching through said exposed chromium layer to expose said underlying phase-shifting layer;

etching through said exposed phase-shifting layer to expose said substrate;

etching away said resist overlying said chromium layer to complete fabrication of said attenuating phase-shifting photomask.

10. The method of claim 9, wherein said substrate is quartz.

11. The method of claim 9, wherein said phase-shifting layer comprises MoSiON and has a thickness from about 1000 and 1600 Å.

12. The method of claim 9, wherein said phase-shifting layer comprises CrON and has a thickness from about 1000 and 1600 Å.

13. The method of claim 9, wherein said chromium layer comprises chromium and chromium oxide.

14. The method of claim 9, wherein said chromium layer has a thickness of from about 950 and 1100 Å.

15. The method of claim 9, wherein the pattern density is calculated by dividing said photomask blank into grid squares having a length by width from about 5.12 by 5.12 to 10.24 by 10.24 $\mu m^2$, and dividing the area of said grid squares by the total area exposed to said first E-beam energy within each said grid square.

16. A method of fabricating an attenuating phase-shifting photomask, comprising the steps:

providing a photomask blank having an upper resist layer overlying a from about 950 to 1100 Å thick chromium layer, said chromium layer overlying a phase-shifting layer, and said phase-shifting layer over a quartz substrate; said photomask blank having a low pattern density area with a pattern density less than 0.25, a middle pattern density area with a pattern density from about 0.25 to 0.70, and a high pattern density area with a pattern density between about 0.70 and 1.00;

exposing said photomask blank to a first E-beam energy in a single step wherein said low pattern density area is exposed to said first E-beam energy adjusted by a first dosage factor of from about 1.3 to 1.4, said middle pattern density area is exposed to said first E-beam energy adjusted by a second dosage factor of from about 1.0 to 1.3, and said high pattern density area is exposed to said first E-beam energy adjusted by a third dosage factor of from about 0.82 to 1.0;

exposing said photoresist blank to a second E-beam energy in a single step wherein said low and middle density areas are equally exposed to said second E-beam energy;

developing said exposed resist layer wherein portions of said resist is removed to expose said chromium layer;

etching through said exposed chromium layer to expose said underlying phase-shifting layer;

etching through said exposed phase-shifting layer to expose said quartz substrate;

etching away said resist overlying said chromium layer to complete fabrication of said attenuating phase-shifting photomask.

17. The method of claim 16, wherein said phase-shifting layer comprises MoSiON and has a thickness from about 1000 and 1600 Å.

18. The method of claim 16, wherein said phase-shifting layer comprises CrON and has a thickness from about 1000 and 1600 Å.

19. The method of claim 16, wherein said chromium layer comprises chromium and chromium oxide.

20. The method of claim 16, wherein the pattern density is calculated by dividing said photomask blank into grid squares having a length by width from about 5.12 by 5.12 to 10.24 by 10.24 $\mu m^2$, and dividing the area of said grid squares by the total area exposed to said first E-beam energy within each said grid square.

* * * * *